United States Patent
Dronavalli

(10) Patent No.: US 7,256,622 B2
(45) Date of Patent: Aug. 14, 2007

(54) AND, OR, NAND, AND NOR LOGICAL GATES

(76) Inventor: Naveen Dronavalli, 5750 Drake Hollow Dr. W, West Bloomfield, MI (US) 48322

( * ) Notice: Subject to any disclaimer, the term of this patent is extended or adjusted under 35 U.S.C. 154(b) by 92 days.

(21) Appl. No.: 11/284,562

(22) Filed: Nov. 22, 2005

(65) Prior Publication Data

US 2006/0119394 A1   Jun. 8, 2006

Related U.S. Application Data

(60) Provisional application No. 60/634,342, filed on Dec. 8, 2004.

(51) Int. Cl.
*H03K 19/20* (2006.01)
*H03K 19/094* (2006.01)

(52) U.S. Cl. ..................... 326/121; 326/114

(58) Field of Classification Search .......... 326/104, 326/105, 106, 108, 112, 113, 114, 118, 119, 326/121, 122
See application file for complete search history.

(56) References Cited

U.S. PATENT DOCUMENTS

| | | | |
|---|---|---|---|
| 3,356,858 A | 12/1967 | Wanlass | |
| 4,541,067 A | 9/1985 | Whitaker | |
| 4,893,031 A | 1/1990 | Masuda | |
| 5,808,483 A | 9/1998 | Sako | |
| 6,144,227 A | 11/2000 | Sato | |
| 6,252,426 B1 | 6/2001 | Fulkerson | |
| 7,176,746 B1 * | 2/2007 | Wang et al. | ................ 327/536 |
| 2006/0028247 A1 * | 2/2006 | Hara et al. | ................ 326/104 |

OTHER PUBLICATIONS

Kazuo Yano et al., A 3.8ns CMOS 16×16-b Multiplier Using Complementary Pass-Transistor Logic, IEEE Journal of Solid-State Circuits, Apr. 1990, pp. 388-395, vol. 25, No. 2.
Makoto Suzuki et al., A 1.5ns 32b CMOS ALU in Double Pass-Transistor Logic, ISSCC 93/Session 5/Microprocessors/Paper TA 5.4, Feb. 25, 1993, pp. 90-91.

* cited by examiner

*Primary Examiner*—Rexford Barnie
*Assistant Examiner*—Thienvu V. Tran

(57) ABSTRACT

A logic family consisting of four basic logical circuits performing AND, OR, NAND and NOR functions is disclosed. The AND and OR logic circuits function without a power supply and complementary input signals. The NAND and NOR logic circuits function without complementary input signals. The AND and OR logic circuits are constructed using two MOS (Metal Oxide Semiconductor) transistors, namely, one P-channel MOS transistor and one N-channel MOS transistor. The NAND and NOR logic circuits are constructed using four MOS transistors, namely, two P-channel MOS transistors and two N-channel MOS transistors. The logic circuits may have higher speed, occupy less area and consume less power because power supply is not needed, complementary input signals are not used and fewer transistors are used. The logic circuits may have increased performance relative to CMOS (Complementary MOS) logic circuits, CPL (Complementary Pass Logic) circuits and DPL (Dual Pass Logic) circuits.

18 Claims, 9 Drawing Sheets

| A | B | OUT |
|---|---|-----|
| L | L | L |
| L | H | L |
| H | L | L |
| H | H | H |

FIG.1

| A | B | OUT |
|---|---|-----|
| L | L | L |
| L | H | H |
| H | L | H |
| H | H | H |

FIG.2

| A | B | OUT |
|---|---|-----|
| L | L | H |
| L | H | H |
| H | L | H |
| H | H | L |

FIG.3

| A | B | OUT |
|---|---|-----|
| L | L | H |
| L | H | L |
| H | L | L |
| H | H | L |

FIG.4

| IN | OUT |
|----|-----|
| L | H |
| H | L |

FIG.5

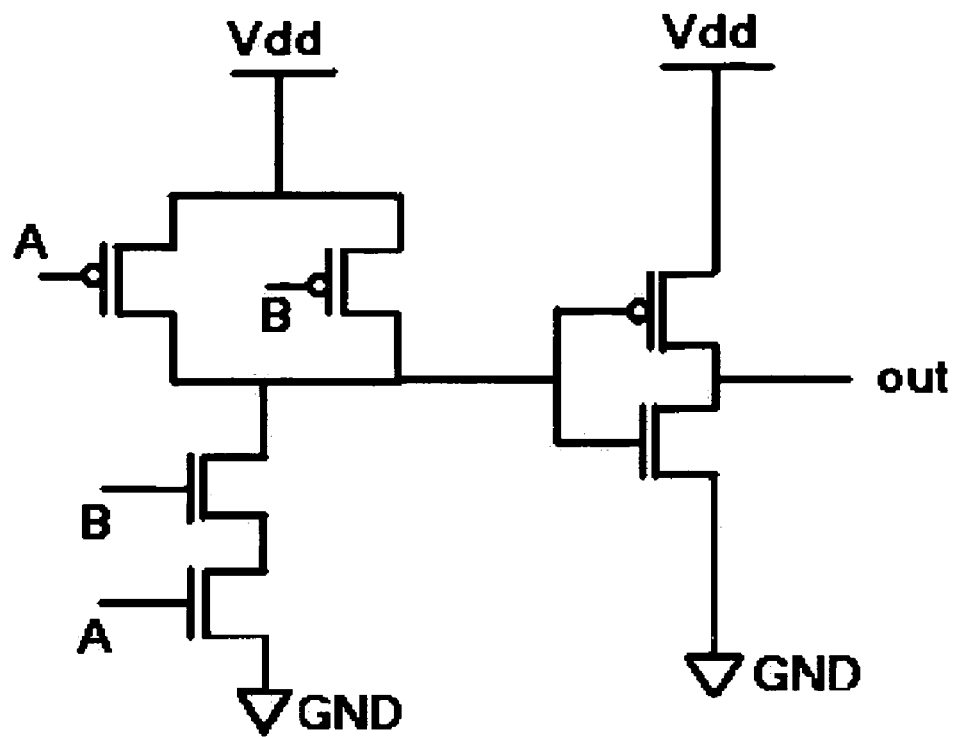
FIG.9: PRIOR ART
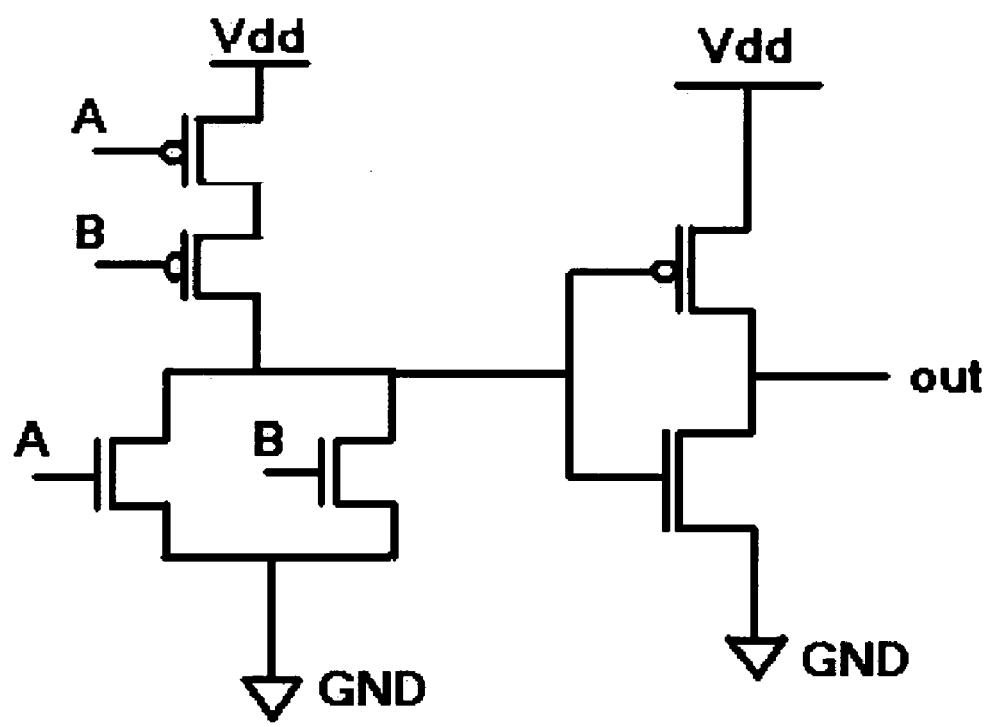
FIG.10: PRIOR ART

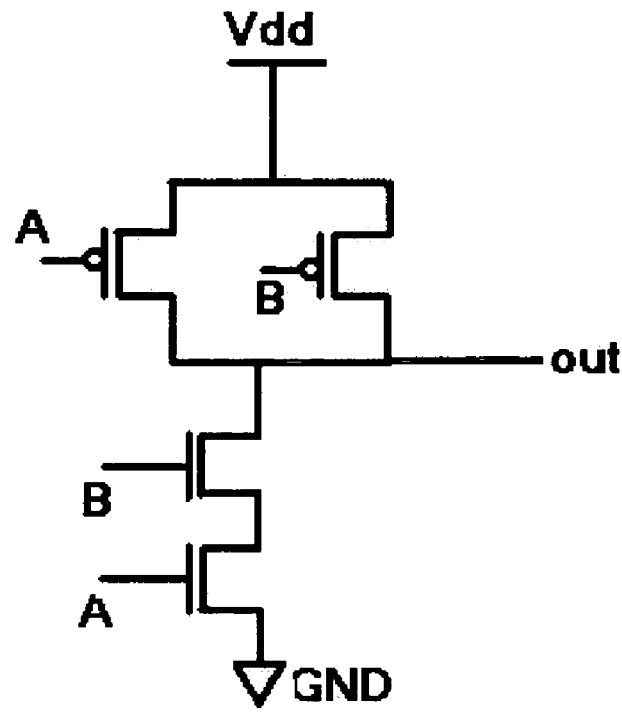
FIG.11: PRIOR ART
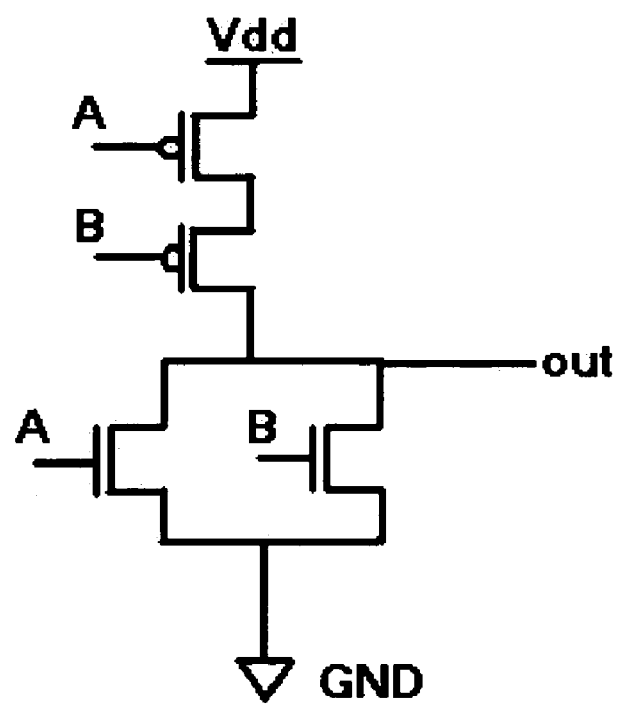
FIG.12: PRIOR ART

| A | B | PMOS | NMOS | OUT |
|---|---|------|------|-----|
| L | L | ON   | OFF  | L   |
| L | H | ON   | OFF  | L   |
| H | L | OFF  | ON   | L   |
| H | H | OFF  | ON   | H   |

| A | B | PMOS | NMOS | OUT |
|---|---|------|------|-----|
| L | L | ON   | OFF  | L   |
| L | H | OFF  | ON   | H   |
| H | L | ON   | OFF  | H   |
| H | H | OFF  | ON   | H   |

| Attribute | Type of Logic Gates (Supply Voltage = Input voltage = 2.8v) | | | |
|---|---|---|---|---|
| | AND | OR | NAND | NOR |
| Delay (Present Invention) | 0.052ns | 0.033ns | 0.1ns | 0.3ns |
| Delay (CMOS) | 0.15ns | 0.22ns | 0.05ns | 0.1ns |
| Power (Present Invention) | 102.6nW | 109.1nW | 1.8μW | 5.9μW |
| Power (CMOS) | 7.58μW | 8.34μW | 3.76μW | 4.2μW |
| Size (Present Invention) | $1008\lambda^2$ | $888\lambda^2$ | $1680\lambda^2$ | $1480\lambda^2$ |
| Size (CMOS) | $2548\lambda^2$ | $2793\lambda^2$ | $1716\lambda^2$ | $1881\lambda^2$ |

FIG.17

AND, OR, NAND, AND NOR LOGICAL GATES

CROSS-REFERENCE TO RELATED APPLICATIONS

This application claims the benefit of provisional patent application, APPL No. 60/634,342 filed on Dec. 8, 2004 by the present inventor.

FEDERALLY SPONSORED RESEARCH

Not Applicable

SEQUENCE LISTING OR PROGRAM

Not Applicable

RELEVANT PRIOR ART

U.S. Pat. No. 3,356,858 Dec. 5, 1967—Wanlass.
U.S. Pat. No. 6,144,227 Nov. 7, 2000—Sato.
U.S. Pat. No. 4,893,031 Jan. 9, 1990—Masuda.
U.S. Pat. No. 5,808,483 Sep. 15, 1998—Sako.
U.S. Pat. No. 4,541,067 Sep. 10, 1985—Whitaker.
U.S. Pat. No. 6,252,426 Jun. 26, 2001—Fulkerson.
"A 3.8 ns CMOS 16×16-b Multiplier Using Complementary Pass-Transistor Logic", Kazuo Yano et al., IEEE Journal of Solid-State Circuits, vol. 25, No. 2, April 1990, pp. 388-395.
"A 1.5 ns 32b CMOS ALU in Double Pass-Transistor Logic," Makoto Suzuki et al., ISSCC 93/Session 5/Microprocessors/Paper TA 5.4, Feb. 25, 1993, pp. 90-91.

BACKGROUND OF THE INVENTION

1. Field of the Invention

This invention relates to logic gates consisting of metal oxide semiconductor (hereinafter, referred to as "MOS") transistors. More specifically, the present invention relates to a MOS logic circuit used to perform AND, OR, NAND and NOR logic functions, which have a reduced number of elements, layout area, power consumption and higher speed of operation.

2. Background of the Invention

A logic gate is an arrangement of electronically controlled switches used to calculate operations in Boolean algebra. Logic gates can be constructed from diodes, relays, transistors and optical elements. The popular gates presently being the CMOS gates that are constructed using complementary metal oxide semiconductors.

Moore's Law states that the speed and density of an integrated circuit will double every 18-24 months. Moore's Law was satisfied until today by simply scaling down the bulk MOSFET devices. However, there exist various transistor effects, namely, short channel effects, gate resistance effects and others arise when the transistor channel lengths scale below 0.25 µm.

Referring to conventional logic families such as complementary metal oxide semiconductor (CMOS) logic as discussed in U.S. Pat. No. 3,356,858 to Frank Wanlass and Pass-transistor logic families like Complementary Pass-transistor Logic (CPL) and Dual Pass-transistor logic (DPL) as discussed in "A 3.8 ns CMOS 16×16-b Multiplier Using Complementary Pass-Transistor Logic" by Kazuo Yano et al., IEEE Journal of Solid-State Circuits, vol. 25, No. 2, April 1990, pp. 388-395 and in "A 1.5 ns 32-b CMOS ALU in Double Pass-Transistor Logic" by Makoto Suzuki et al., ISSCC 93/Session 5/Microprocessors/Paper TA 5.4, Feb. 25, 1993, pp. 90-91 require having complementary input signals to achieve the desired logical function. CMOS logic families need a power supply rail and ground rail to implement a logical function.

The CMOS logic requires six transistors, power and ground rails to implement an AND gate which is shown in FIG. 9. The CPL and DPL require four transistors and prior availability of complementary input signals. There has been no logic gate, which uses just two transistors, no power and ground rails, and no complementary input signals.

BACKGROUND OF THE INVENTION—OBJECTS AND ADVANTAGES

The objects and advantages of the present invention are:
(a). To provide a logical circuit for performing logical functions without the use of the power supply.
(b). To provide a logical circuit for performing logical functions using minimum number of MOS transistors.
(c). To provide a logical circuit for performing logical functions without requiring complementary input signals.
(d). The AND gate (FIG. 13A) and OR gate (FIG. 14A) in accordance to the present invention achieve much higher speed than their CMOS logic counterparts (FIG. 9 and FIG. 10) do.
(e). The AND gate (FIG. 13A) and OR gate (FIG. 14A) in accordance to the present invention occupy very less layout area than their CMOS logic counterparts (FIG. 9 and FIG. 10) do.
(f). The CMOS AND and OR logic gates require six MOS transistors to implement their functions; whereas, the present invention requires only two MOS transistors to implement the same above said functions. The NAND gate (FIG. 15) and the NOR gate (FIG. 16) of the present invention occupy lesser area than their CMOS counterparts.
(g). The AND gate (FIG. 13A) and OR gate (FIG. 14A) consume very little power than their CMOS logic counterparts (FIG. 9 and FIG. 10). The NAND gate (FIG. 15) and the NOR gate (FIG. 16) have almost the same amount of power consumption as their CMOS counterparts.
(h). The above mentioned advantages [(d), (e), (f) and (g)], namely, higher speed, reduced layout area, reduced elements and reduced power consumption are the most important improvement factors in any semiconductor integrated circuit. These and other advantages of the present invention will become apparent to those skilled in the art upon reading and understanding the following detailed description with references to the accompanying figures.

BRIEF DESCRIPTION OF THE DRAWINGS

FIG. 1 shows the truth table of the logical operation of a two-input AND logic gate.
FIG. 2 shows the truth table of the logical operation of a two-input OR logic gate.
FIG. 3 shows the truth table of the logical operation of a two-input NAND logic gate.
FIG. 4 shows the truth table of the logical operation of a two-input NOR logic gate.
FIG. 5 shows the truth table of the logical operation of a NOT logic gate.

FIG. 9 shows the schematic diagram of the conventional two-input CMOS AND logic gate.

FIG. 10 shows the schematic diagram of the conventional two-input CMOS OR logic gate.

FIG. 11 shows the schematic diagram of the conventional two-input CMOS NAND logic gate.

FIG. 12 shows the schematic diagram of the conventional two-input CMOS NOR logic gate.

FIG. 17 is a table showing the comparison of various attributes between the CMOS logic gates and the logic gates of the present invention. Here in the table, the unit for time is nano-second (ns), the unit for power consumption are micro-watt (μW) and nano-watt (nW), and the layout area is expressed in terms of $\lambda^2$ (where, $\lambda$ represents the actual length of the grid. For example, if the channel length L of the MOS transistor=0.61 μm for a particular fabrication technology, then $\lambda = L/2 = 0.6/2 = 0.3$ μm).

REFERENCE NUMERALS USED IN THE DRAWINGS AND DESCRIPTION

Figure 6:
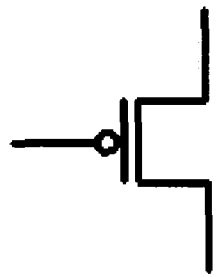
FIG. 6 shows the symbol used for a P-channel MOS transistor (hereinafter, simply referred to as "PMOS").
Figure 7:
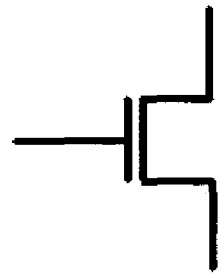
FIG. 7 shows the symbol used for a N-channel MOS transistor (hereinafter, simply referred to as "NMOS").

101—Input to the AND logic gate.
102—Input to the AND logic gate.
103—Source terminal of the PMOS (150).
104—Drain terminal of the PMOS (150).
105—Source terminal of the NMOS (151).
106—Drain terminal of the NMOS (151).
107—point where the source (103) of the PMOS (150), the gate terminals of PMOS (150) and NMOS (151) are all connected.
108—Output of the AND logic gate.
111—The AND logic gate in accordance with the present invention.
201—Input to the OR logic gate.
202—Input to the OR logic gate.
203—Source terminal of the PMOS (250).
204—Drain terminal of the PMOS (250).
205—Source terminal of the NMOS (251).
206—Drain terminal of the NMOS (251).
207—point where the source (205) of the NMOS (251), the gate terminals of PMOS (250) and NMOS (251) are all connected.
208—Output of the OR logic gate.
222—The OR logic gate in accordance with the present invention.
333—point where the AND gate (111) is connected to the input of the CMOS NOT gate (FIG. 8).
444—point where the OR gate (222) is connected to the input of the CMOS NOT gate (FIG. 8).
1c2—point where the AND gate (111) is connected to another AND gate (111) to form multiple input AND gate.
12—point where the OR gate (222) is connected to another OR gate (222) to form multiple input OR gate.
S—Source of the corresponding MOS transistor.
G—Gate of the corresponding MOS transistor.
D—Drain of the corresponding MOS transistor.
in—Input of the corresponding logic circuit.
out—Output of the corresponding logic circuit.
Vdd—Power supply to the corresponding logic circuit.
GND—Ground terminal to the corresponding logic circuit.

SUMMARY OF THE INVENTION

The present invention implements a MOS transistor logic family that has higher performance relative to CMOS, CPL and DPL logic families. It has been discovered that the AND and OR logic gates of the present invention require fewer MOS transistors, occupy lesser layout area, and consume very little power. Also, the NAND and NOR logic gates were constructed using the above said AND and OR logic gates of the present invention. The NAND and NOR logic gates have less power consumption and occupy less area relative to the CMOS counterparts.

The first embodiment of the present invention, a two-input AND logic gate comprises of two MOS transistors. The gate and drain terminals of both transistors are coupled. The two inputs are given separately to each of the source terminals of the respective MOSFET's. The source and the gate terminals of the PMOS are coupled, to which one of the inputs is coupled. The other input is given to the source of the NMOS.

The two-input OR logic gate of the present invention comprises of two MOS transistors. The gate and drain terminals of both transistors are coupled. The two inputs are given separately to each of the source terminals of the respective MOSFET's. The source and the gate terminals of the NMOS are coupled, to which one of the inputs is coupled. The other input is given to the source of the PMOS.

The two-input NAND logic gate of the present invention comprises of the above described two-input AND logic gate of the present invention connected to a CMOS NOT gate. The output of the AND logic gate is connected to the input of the CMOS NOT gate to achieve the NAND logic function.

The two-input NOR logic gate of the present invention comprises of the above described two-input OR logic gate of the present invention connected to a CMOS NOT gate. The output of the OR logic gate is connected to the input of the CMOS NOT gate to achieve the NOR logic function.

Multiple-input AND/OR/NAND/NOR logic gates of the present invention can be formed by simply cascading multiple two-input logic gates. For example, a three-input AND gate of the present invention can be formed by connecting one two-input AND gate to another two-input AND gate, where the output of the preceding AND gate is coupled to the source of the NMOS of the following AND gate. The source of the PMOS in the following AND gate being the third input.

The various attributes of the logic family in accordance with the present invention are compared to that of the CMOS logic family as shown in FIG. 17.

DETAILED DESCRIPTION OF THE PREFERRED EMBODIMENTS

Figures 13A, 13B:
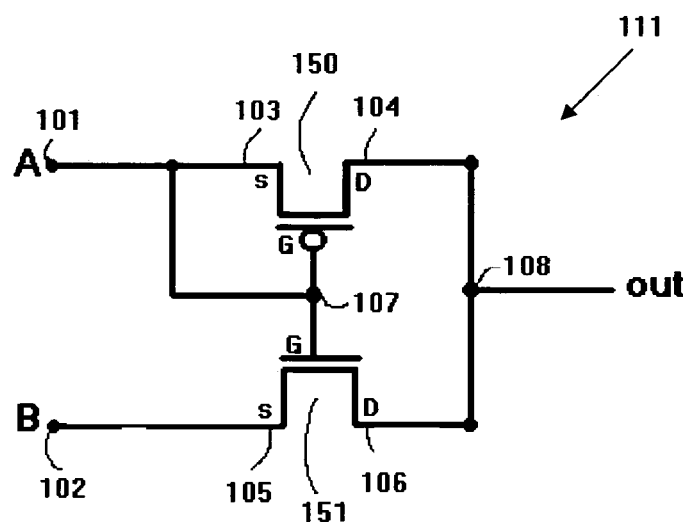
FIG. 13A shows the schematic diagram of an illustrative two-input AND logic gate in accordance with the present invention.
FIG. 13B is a table showing the switching of the transistors for the two-input AND logic gate as shown in FIG. 13A.

FIG. 13A is a schematic diagram of an illustrative two-input AND logic gate in accordance with the present invention. The two-input AND gate is shown at 111. The two-input AND logic gate 111 includes two input signals A and B at 101 and 102.

It consists of two MOS transistors, one PMOS 150 and one NMOS 151. The source terminal 103 of the PMOS 150 is coupled to the input signal A 101. The source terminal 103 of the PMOS 150 is also coupled to the gate terminal of the PMOS 150 and to the gate terminal of NMOS 151 at 107. The source terminal 105 of the NMOS 151 is coupled to the input signal B 102. The gate terminal of the PMOS 150 and the gate terminal of the NMOS 151 are coupled to each other at 107. The drain terminal 104 of the PMOS 150 is coupled to the drain terminal 106 of the NMOS 151. Finally, the output 108 of the two-input AND logic gate 111 is coupled to the drain terminal 104 of the PMOS 150 and to the drain terminal 106 of the NMOS 151.

The conventional two-input CMOS AND logic gate shown in FIG. 9 uses six MOS transistors and power supply to implement the AND function. The two-input AND gate 111 shown in FIG. 13A uses only two MOS transistors and no power supply to implement the same AND function. Simulations show that the AND logic gate 111 in FIG. 13A of the present invention consumes very little power, occupies less physical space and operates at a higher speed than its CMOS counterpart shown in FIG. 9.

The operation of the AND logic gate 111 shown in FIG. 13A in accordance with the present invention is as follows:

When the input A 101 and the input B 102 are low, the PMOS 150 is "on" and the NMOS 151 is "off" allowing input A 101 to be passed to the output 108.

When the input A 101 is low and the input B 102 is high, the PMOS 150 is "on" and the NMOS 151 is "off" allowing input A 101 to be passed to the output 108.

When the input A 101 is high and the input B 102 is low, the PMOS 150 is "off" and the NMOS 151 is "on" allowing input B 102 to be passed to the output 108.

Finally, when the input A 101 is high and the input B 102 is high, the PMOS 150 is "off" and the NMOS 151 is "on" allowing input B 102 to be passed to the output 108. Thus, performing the AND logic gate function according to its truth table shown in FIG. 1. The switching of the MOS transistors in the AND gate 111 while in operation for all the input signals is shown in FIG. 13B.

Figures 14A, 14B:
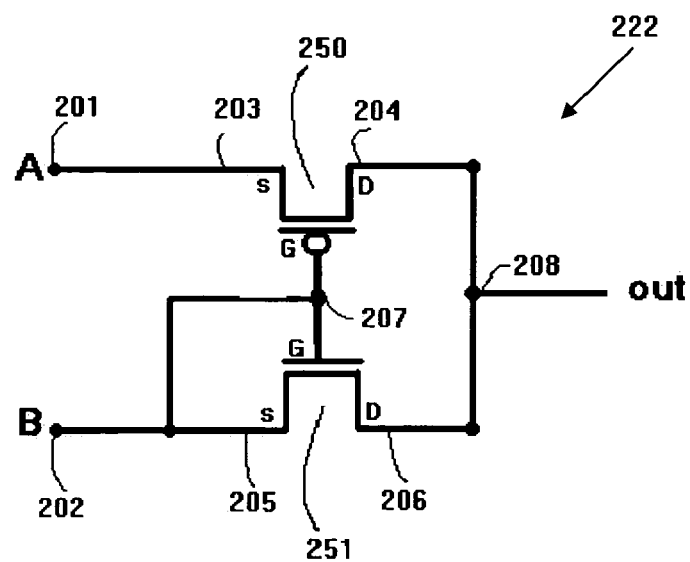
FIG. 14A shows the schematic diagram of an illustrative two-input OR logic gate in accordance with the present invention.
FIG. 14B is a table showing the switching of the transistors for the two-input OR logic gate as shown in FIG. 14A.

FIG. 14A is a schematic diagram of an illustrative two-input OR logic gate in accordance with the present invention. The two-input OR gate is shown at 222. The two-input OR logic gate 222 includes two input signals A and B at 201 and 202.

It consists of two MOS transistors, one PMOS 250 and one NMOS 251. The source terminal 203 of the PMOS 250 is coupled to the input signal A 201. The source terminal 205 of the NMOS 251 is coupled to the input signal B 202. The source terminal 205 of the NMOS 251 is also coupled to the gate terminal of the NMOS 251 and to the gate terminal of PMOS 250 at 207. The gate terminal of the PMOS 250 and the gate terminal of the NMOS 251 are coupled to each other at 207. The drain terminal 204 of the PMOS 250 is coupled to the drain terminal 206 of the NMOS 251. Finally, the output 208 of the two-input OR logic gate 222 is coupled to the drain terminal 204 of the PMOS 250 and to the drain terminal 206 of the NMOS 251.

The conventional two-input CMOS OR logic gate shown in FIG. 10 uses six MOS transistors and power supply to implement the OR function. The two-input OR gate 222 shown in FIG. 14A uses only two MOS transistors and no power supply to implement the same OR function. Simulations have shown that the OR logic gate 222 in FIG. 14A of the present invention consumes very little power, occupies less physical space and operates at a higher speed than its CMOS counterpart shown in FIG. 10.

The operation of the OR logic gate 222 shown in FIG. 14A in accordance with the present invention is as follows:

When the input A 201 and the input B 202 are low, the PMOS 250 is "on" and the NMOS 251 is "off" allowing input A 201 to be passed to the output 208.

When the input A 201 is low and the input B 202 is high, the PMOS 250 is "off" and the NMOS 251 is "on" allowing input B 202 to be passed to the output 208.

When the input A 201 is high and the input B 202 is low, the PMOS 250 is "on" and the NMOS 251 is "off" allowing input A 201 to be passed to the output 208.

Finally, when the input A 201 is high and the input B 202 is high, the PMOS 250 is "off" and the NMOS 251 is "on" allowing input B 202 to be passed to the output 208. Thus, performing the OR logic gate function according to its truth table shown in FIG. 2. The switching of the MOS transistors in the OR gate 222 while in operation for all the input signals is shown in FIG. 14B.

Figure 8:
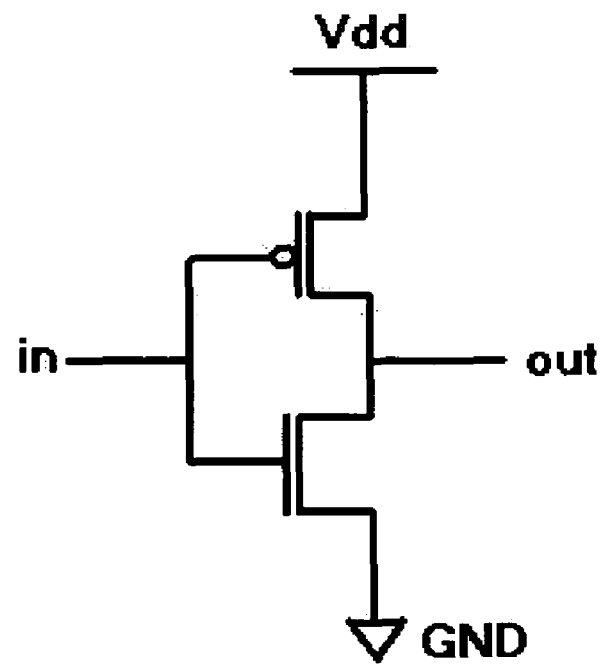
FIG. 8 shows the schematic diagram of the conventional CMOS NOT logic gate.
Figure 15:
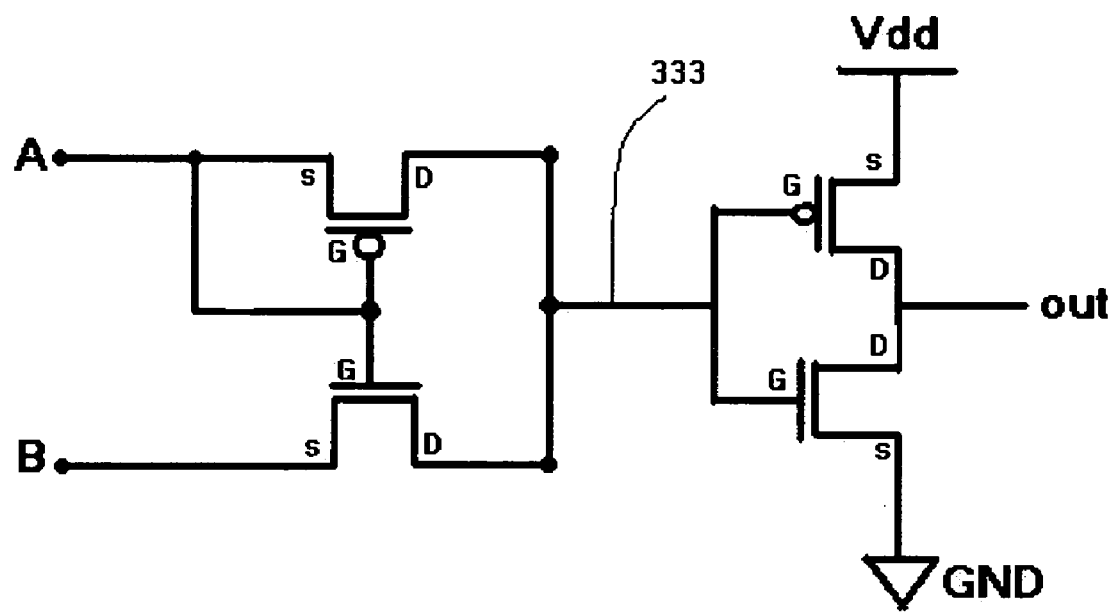
FIG. 15 shows the schematic diagram of an illustrative two-input NAND logic gate in accordance with the present invention.

FIG. 15 is a schematic diagram of an illustrative two-input NAND logic gate in accordance with the present invention. It consists of the AND logic gate 111 (FIG. 13A) and the CMOS NOT gate (FIG. 8). The NAND logic gate function is achieved by simply connecting the output 108 of the AND logic gate 111 (FIG. 13A) to the input in of the CMOS NOT gate (FIG. 8) at 333 as shown in FIG. 15.

Figure 16:
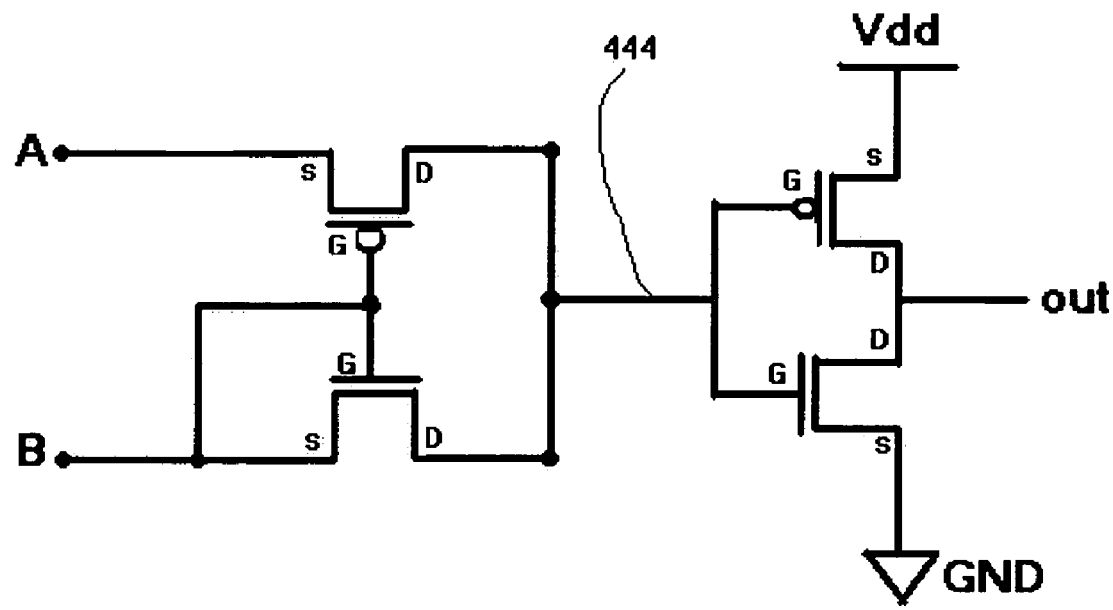
FIG. 16 shows the schematic diagram of an illustrative two-input NOR logic gate in accordance with the present invention.

FIG. 16 is a schematic diagram of an illustrative two-input NOR logic gate in accordance with the present invention. It consists of the OR logic gate 222 (FIG. 14A) and the CMOS NOT gate (FIG. 8). The NOR logic gate function is achieved by simply connecting the output 208 of the OR logic gate 222 (FIG. 14A) to the input in of the CMOS NOT gate (FIG. 8) at 444 as shown in FIG. 16.

Figure 18:
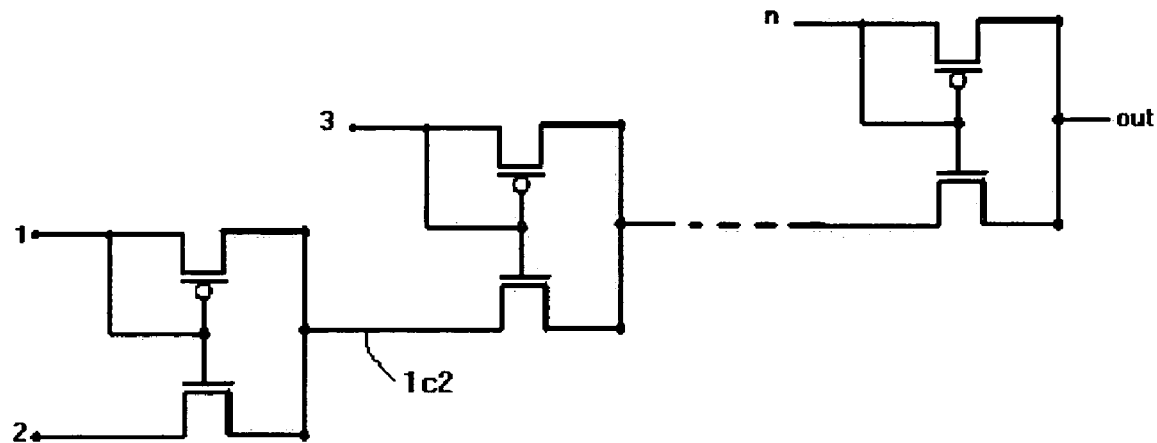
FIG. 18 shows the schematic diagram of an illustrative multiple-input AND logic gate in accordance with the present invention.

FIG. 18 is a schematic diagram of an illustrative multiple-input AND logic gate in accordance with the present invention. It consists of the AND logic gate 111 (FIG. 13A) cascaded with another AND logic gate 111 (FIG. 13A) at 1c2 to form a three-input AND logic gate. Cascading multiple AND logic gate 111 (FIG. 13A) cells will form a multiple input AND logic gate, where the output of the preceding AND gate 111 is coupled to the source of the NMOS of the following AND gate 111 as shown in FIG. 18.

Figure 19:
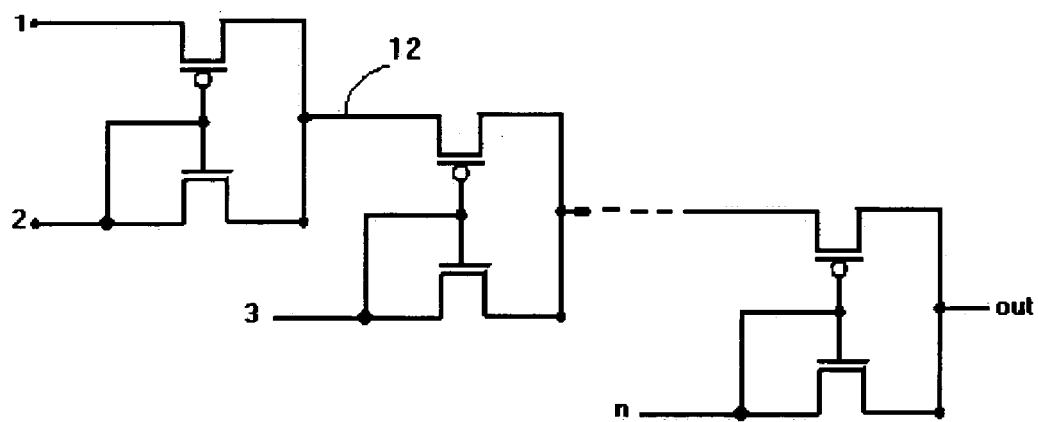
FIG. 19 shows the schematic diagram of an illustrative multiple-input OR logic gate in accordance with the present invention.

FIG. 19 is a schematic diagram of an illustrative multiple-input OR logic gate in accordance with the present invention. It consists of the OR logic gate 222 (FIG. 14A) cascaded with another OR logic gate 222 (FIG. 14A) at 12 to form a three-input OR logic gate. Cascading multiple OR logic gate 222 (FIG. 14A) cells will form a multiple input OR logic gate, where the output of the preceding OR gate 222 is coupled to the source of the PMOS of the following OR gate 222 as shown in FIG. 18.

CONCLUSIONS, RAMIFICATIONS, AND SCOPE

The logic gates of the present invention in their preferred embodiments are versatile, simple, improved, easy and less expensive to manufacture. Specifically, the AND and OR logic gates require no power supply, occupy 65% lesser physical area and operate at much higher speed when compared to their CMOS counterparts.

These substantial improvements in speed, area and power consumption will be very useful for many integrated circuits. They can be manufactured as individual logic IC's (Integrated Circuits) or they can be used in complex VLSI (Very Large Scale Integration) logic circuits.

While the above description contains much specificity, these should not be construed as limitations on the scope of the invention, but as exemplifications of the presently preferred embodiments thereof. Many other ramifications and variations are possible within the teachings of the invention. For example, the MOSFET process parameters can be changed. The MOSFET models can also be changed. Buffers may be added incase of multiple input gates.

Thus, the scope of the invention should be determined by the appended claims and their legal equivalents, and not by the examples given.

What is claimed is:

1. A logic circuit having an output for performing logical operations without a power supply and without complementary input signals, comprising:
   (a) a first type MOS transistor having a source, a drain and a gate, the source of the said first MOS transistor is coupled to a first input terminal, the source of the said first MOS transistor is also coupled to the gate of the said first MOS transistor, the gate of the said first MOS transistor is coupled to a gate of a second type MOS transistor, the drain of the said first MOS transistor is coupled to the output of the logic circuit and
   (b) a second type MOS transistor having a source, a drain and a gate, the source of the said second MOS transistor is coupled to a second input terminal, the gate of the said second MOS transistor is coupled to the gate of the said first MOS transistor, the drain of the said second MOS transistor is coupled to the output of the logic circuit.

whereby logical operation of the two input signals applied to the said first and said second input terminals is performed.

2. The logic circuit as claimed in claim 1, wherein said first type MOS transistor is a P-channel MOS transistor and said second type MOS transistor is a N-channel MOS transistor.

3. The logic circuit as claimed in claim 2, wherein the logic circuit has an AND gate function when the input signals applied are a first value A and a second value B, respectively.

4. The logic circuit as claimed in claim 1, wherein the logic circuit has an AND gate function when the input signals applied are a first value A and a second value B, respectively.

5. The logic circuit as claimed in claim 3, wherein each of the logic circuit having the AND gate function is cascaded successively in order to produce a multiple AND gate function.

6. A logic circuit having an output for performing logical operations without a power supply and without complementary input signals, comprising:
   (a) a first type MOS transistor having a source, a drain and a gate, the source of the said first MOS transistor is coupled to a first input terminal, the gate of the said first MOS transistor is coupled to a gate of a second type MOS transistor, the drain of the said first MOS transistor is coupled to the output of the logic circuit and
   (b) a second type MOS transistor having a source, a drain and a gate, the source of the said second MOS transistor is coupled to a second input terminal, the source of the said second MOS transistor is also coupled to the gate of the said second MOS transistor, the gate of the said second MOS transistor is coupled to the gate of the first MOS transistor, the drain of the said second MOS transistor is coupled to the output of the logic circuit.

whereby logical operation of the two input signals applied to the said first and said second input terminals is performed.

7. The logic circuit as claimed in claim 6, wherein said first type MOS transistor is a P-channel MOS transistor and said second type MOS transistor is a N-channel MOS transistor.

8. The logic circuit as claimed in claim 7, wherein the logic circuit has an OR gate function when the input signals applied are a first value A and a second value B, respectively.

9. The logic circuit as claimed in claim 6, wherein the logic circuit has an OR gate function when the input signals applied are a first value A and a second value B, respectively.

10. The logic circuit as claimed in claim 7, wherein each of the logic circuit having the OR gate function is cascaded successively in order to produce a multiple OR gate function.

11. A logic circuit having an output for performing logical operations without complementary input signals, comprising:
   (a) a first type MOS transistor having a source, a drain and a gate, the source of the said first MOS transistor is coupled to a first input terminal, the source of the said first MOS transistor is also coupled to the gate of the said first MOS transistor, the gate of the said first MOS transistor is coupled to a gate of a second type MOS transistor, the drain of the said first MOS transistor is coupled to a gate of a third MOS transistor and
   (b) a second type MOS transistor having a source, a drain and a gate, the source of the said second MOS transistor is coupled to a second input terminal, the gate of the said second MOS transistor is coupled to the gate of the said first MOS transistor, a gate of a said second MOS transistor is coupled to the drain of the fourth MOS transistor and
   (c) a third type MOS transistor having a source, a drain and a gate, the source of the said third MOS transistor is coupled to a power supply, the gate of the said third MOS transistor is coupled to the drain of the said first MOS transistor, the drain of the said third MOS transistor is coupled to the output of the logic circuit and
   (d) a fourth type MOS transistor having a source, a drain and a gate, the source of the said fourth MOS transistor is coupled to the ground terminal, the gate of the said fourth MOS transistor is coupled to the drain of the said second MOS transistor, the drain of the said fourth MOS transistor is coupled to the output of the logic circuit.

whereby logical operation of the two input signals applied to the said first and said second input terminals is performed.

12. The logic circuit as claimed in claim 11, wherein said first type MOS transistor is a P-channel MOS transistor, the said second type MOS transistor is a N-channel MOS transistor, the said third type MOS transistor is a P-channel MOS transistor and the said fourth type MOS transistor is a N-channel MOS transistor.

13. The logic circuit as claimed in claim 12, wherein the logic circuit has a NAND gate function when the input signals applied are a first value A and a second value B, respectively.

14. The logic circuit as claimed in claim 11, wherein the logic circuit has a NAND gate function when the input signals applied are a first value A and a second value B, respectively.

15. A logic circuit having an output for performing logical operations without complementary input signals, comprising:
  (a) a first type MOS transistor having a source, a drain and a gate, the source of the said first MOS transistor is coupled to a first input terminal, the gate of the said first MOS transistor is coupled to a gate of a second type MOS transistor, the drain of the said first MOS transistor is coupled to a gate of a third MOS transistor and
  (b) a second type MOS transistor having a source, a drain and a gate, the source of the said second MOS transistor is coupled to a second input terminal, the source of the said second MOS transistor is also coupled to the gate of the said second MOS transistor, the gate of the said second MOS transistor is coupled to the gate of the first MOS transistor, the drain of the said second MOS transistor is coupled to a gate of a fourth MOS transistor and
  (c) a third type MOS transistor having a source, a drain and a gate, the source of the said third MOS transistor is coupled to a power supply, the gate of the said third MOS transistor is coupled to the drain of the said first MOS transistor, the drain of the said third MOS transistor is coupled to the output of the logic circuit and
  (d) a fourth type MOS transistor having a source, a drain and a gate, the source of the said fourth MOS transistor is coupled to the ground terminal, the gate of the said fourth MOS transistor is coupled to the drain of the said second MOS transistor, the drain of the said fourth MOS transistor is coupled to the output of the logic circuit.

whereby logical operation of the two input signals applied to the said first and said second input terminals is performed.

16. The logic circuit as claimed in claim 15, wherein said first type MOS transistor is a P-channel MOS transistor, the said second type MOS transistor is a N-channel MOS transistor, the said third type MOS transistor is a P-channel MOS transistor and the said fourth type MOS transistor is a N-channel MOS transistor.

17. The logic circuit as claimed in claim 16, wherein the logic circuit has a NOR gate function when the input signals applied are a first value A and a second value B, respectively.

18. The logic circuit as claimed in claim 15, wherein the logic circuit has a NOR gate function when the input signals applied are a first value A and a second value B, respectively.

* * * * *